United States Patent
Silova

(10) Patent No.: US 9,472,313 B2
(45) Date of Patent: Oct. 18, 2016

(54) REFLECTIVE OPTICAL COMPONENTS FOR LITHOGRAPHIC APPARATUS AND DEVICE MANUFACTURING METHOD

(75) Inventor: Marianna Yuryevna Silova, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 959 days.

(21) Appl. No.: 13/357,771

(22) Filed: Jan. 25, 2012

(65) Prior Publication Data

US 2012/0188522 A1 Jul. 26, 2012

Related U.S. Application Data

(60) Provisional application No. 61/436,303, filed on Jan. 26, 2011.

(51) Int. Cl.
| | |
|---|---|
| *G03B 27/54* | (2006.01) |
| *G21K 1/06* | (2006.01) |
| *B82Y 10/00* | (2011.01) |
| *G03F 7/20* | (2006.01) |
| *G02B 5/08* | (2006.01) |

(52) U.S. Cl.
CPC ............ *G21K 1/062* (2013.01); *B82Y 10/00* (2013.01); *G02B 5/0891* (2013.01); *G03F 7/70316* (2013.01); *G03F 7/70958* (2013.01)

(58) Field of Classification Search
CPC ........... G03F 7/70316; G03F 7/70958; G02B 5/0891; G21K 1/062
USPC ............................ 355/53, 67, 77; 250/492.2
See application file for complete search history.

(56) References Cited

U.S. PATENT DOCUMENTS

| | | | |
|---|---|---|---|
| 5,958,605 A * | 9/1999 | Montcalm et al. | 428/627 |
| 6,724,462 B1 * | 4/2004 | Singh et al. | 355/53 |
| 6,780,496 B2 | 8/2004 | Bajt et al. | |
| 7,193,228 B2 | 3/2007 | Bowering et al. | |
| 7,592,610 B2 | 9/2009 | Bakker et al. | |
| 2002/0171922 A1 | 11/2002 | Shiraishi et al. | |
| 2004/0105083 A1 * | 6/2004 | Kurt et al. | 355/67 |
| 2008/0143981 A1 * | 6/2008 | Ehm | B82Y 10/00 355/30 |
| 2008/0259439 A1 * | 10/2008 | Shiraishi | B82Y 10/00 359/360 |
| 2011/0096428 A1 * | 4/2011 | Metzmacher | B82Y 10/00 359/884 |

FOREIGN PATENT DOCUMENTS

| | | |
|---|---|---|
| CN | 1350185 A | 5/2002 |
| CN | 1609715 A | 4/2005 |
| JP | 2001-523007 | 11/2001 |

(Continued)

*Primary Examiner* — Deoram Persaud
(74) *Attorney, Agent, or Firm* — Pillsbury Winthrop Shaw Pittman LLP

(57) ABSTRACT

A reflective optical component is configured to reflect EUV radiation. The reflective optical component has a reflective layer with a bimetal cap layer of differing first and second metals selected to ensure that the outer surface of the cap layer is substantially unreactive or non-adsorptive to sulfur. The bimetal cap layer may be an alloy of the two metals or may consist of a base layer of the first metal deposited on the reflective layer and a surface layer of the second metal on the base layer. The interaction of the two metals may lead to modification of the bonding energy to the outer face of the cap layer of sulfur-containing molecules such as $SO_2$ so that sulfur adsorption, which leads to loss of reflectivity, is reduced or eliminated.

17 Claims, 2 Drawing Sheets

(56) References Cited

FOREIGN PATENT DOCUMENTS

| JP | 2005-516182 | 6/2005 |
| JP | 2007-528608 | 10/2007 |
| JP | 2008-205376 | 9/2008 |
| JP | 2008-293032 | 12/2008 |
| WO | 03/005377 | 1/2003 |

* cited by examiner

REFLECTIVE OPTICAL COMPONENTS FOR LITHOGRAPHIC APPARATUS AND DEVICE MANUFACTURING METHOD

CROSS-REFERENCE TO RELATED APPLICATIONS

This application claims the benefit of priority from U.S. Provisional Patent Application No. 61/436,303, filed Jan. 26, 2011, the entire content of which is incorporated herein by reference.

FIELD

The present invention relates to reflective optical components for a lithographic apparatus for device manufacture, particularly to reflective optical components suitable for reflecting extreme ultraviolet (EUV) radiation for use in device lithography.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \tag{1}$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture (NA) or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, or example within the range of 5-10 nm, such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

SUMMARY OF THE INVENTION

In current designs for lithographic apparatus operating in the EUV range (with wavelengths typically of 5-20 nm) of the electromagnetic spectrum it is desirable to provide highly reflective elements in order to condition and pattern a beam for transferring a pattern from a patterning device onto a substrate and for maintaining a high productivity of the lithographic tool. This part of the electromagnetic spectrum is very sensitive for transmission losses since the radiation is easily absorbed by most surfaces. Multilayer mirrors are typically used, such as mirrors having alternating layers of molybdenum or diamond-like carbon (DLC) and silicon. These act to reflect EUV radiation by means of co-operative interlayer interference. There may be more than 50 alternating double layers of Mo/Si used to form a reflective coating, with each double layer perhaps having a thickness of less than 10 nm. Other EUV mirrors may have multilayers of diamond-like carbon with silicon. Typically, these reflective surfaces may be provided with a metal top layer such as a ruthenium (Ru) layer. The metal top layer is used to prevent oxidation, but may give rise to a decrease in reflectivity of the reflective coating.

The ruthenium cap layer is useful as a protective layer which is easily cleaned to remove deposits which build up during use of EUV lithography apparatus, and is resistant to oxide formation, and does not lead to excessive loss in reflectivity for EUV. However, it has been found that ruthenium is relatively easily contaminated with sulphur from sulphur compounds present as contaminants during use of the lithography apparatus or present as contaminants during the in-situ cleaning processes. This leads to a build up of sulfur or sulfur compounds on the reflective surfaces, eventually leading to loss in reflectivity for EUV radiation. Contaminants may originate, for instance, from resist, from materials used, and partly from environmental air to which reflective surfaces may be exposed during maintenance activity.

It is desirable to provide protective layers for EUV reflective surfaces which maintain EUV reflectivity in the presence of sulfur compound contaminants, and/or from which sulfur or sulfur compounds may be easily cleaned.

It is an aspect of embodiments of the invention, amongst others, to provide a protective cap layer for reflective EUV optical components for use in lithography apparatus which reduces sulfur contamination without substantial loss of EUV reflectance.

According to an aspect of the invention, there is provided a reflective optical component suitable for reflection of EUV radiation comprising a reflective layer having a bimetal cap layer thereon, wherein the bimetal cap layer comprises a first metal and second metal, different from the first metal, wherein the outer surface of the cap layer is substantially unreactive to sulfur compounds. Desirably, the first metal and the second metal each exhibit a high transmissivity to EUV radiation.

At least one embodiment of the invention may provide a reflective optical component suitable for reflection of EUV radiation comprising a reflective layer having a cap layer thereon, wherein the cap layer is an alloy of a first metal and second metal, different from the first metal, adapted to render the an outer surface of the cap layer substantially unreactive to sulfur compounds.

At least one embodiment of the invention may also provide a reflective optical component suitable for reflection of EUV radiation comprising a reflective layer, a base layer of a first metal, desirably a metal exhibiting high transmissivity for EUV radiation, for instance selected from the group consisting of ruthenium, rhenium and palladium, titanium and zirconium, deposited thereon and a surface layer of a second metal deposited on the base layer, wherein the surface layer comprises fewer than 5 monolayers of the second metal, and wherein the outer face of the surface layer has a lower adsorption coefficient for sulfur than a surface of the first metal.

According to an aspect of the invention, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the radiation beam is an EUV radiation beam and wherein the lithographic apparatus comprises one or more reflective optical components according to an aspect of the invention.

According to an aspect of the invention, there is provided a lithographic projection apparatus arranged to project a pattern of EUV radiation from a patterning device onto a substrate, wherein the lithographic projection apparatus comprises one or more reflective optical components according to an aspect of the invention.

According to an aspect of the invention, there is provided an illumination apparatus for EUV lithography, arranged to condition an EUV radiation beam, wherein the illumination apparatus comprises one or more reflective optical components according to an aspect of the invention.

An EUV source, suitable for EUV lithography, comprising one or more reflective optical components according to an aspect of the invention is also provided as an aspect of the invention.

According to an aspect of the invention, there is provided the use of a bimetal cap layer comprising a first metal and second metal, different from the first metal, as a coating on optical components arranged to reflect EUV in a lithographic apparatus, to reduce loss of EUV reflectivity of the optical components arising from deposition of sulfur-containing contaminants.

According to an aspect of the invention, there is provided a device manufacturing method that includes reflecting an EUV radiation beam with a reflective optical component configured to reflect EUV radiation, the reflective optical component comprising a reflective layer having a bimetal cap layer thereon, the bimetal cap layer comprising a first metal and second metal, different from the first metal, wherein an outer surface of the cap layer is substantially unreactive to sulfur compounds; and projecting a patterned EUV radiation beam onto a substrate.

According to an aspect of the invention, there is provided a reflective optical component suitable for reflection of EUV radiation that includes a reflective layer having a bimetal cap layer thereon is provided as an aspect of the invention. The bimetal cap layer may comprise a first metal, and second metal, different from the first metal, whereby the outer surface of the cap layer is substantially unreactive to sulfur compounds. The bimetal cap layer, may, for example, be an alloy of the first and second metals, comprising from 3:1 to 1:3 molar ratio of the first metal to the second metal, for example, from 2:1 to 1:2, or from 3:2 to 2:3.

In an embodiment, the bimetal cap layer may comprises a base layer of a first metal and a surface layer of second metal, different from the first metal, provided on the base layer. The surface layer may comprise fewer than 5 monolayers of the second metal, for instance 3 or fewer, or may be substantially (i.e. within +/−20% by molar composition) a monolayer of the second metal.

Desirably, the bimetal cap layer has a thickness of 4 nm or less, such as 2 nm or less.

The first metal may be any suitable metal; particularly it may be selected from metals having a high transmissivity for EUV radiation. For instance, the first metal may be selected from the group consisting of ruthenium, rhodium, palladium, osmium, iridium, titanium, niobium, and zirconium, such as from the group consisting of ruthenium, rhodium, palladium, titanium, and zirconium, such as palladium or titanium.

The second metal may be selected from any metal selected from metals having a high transmissivity for EUV radiation. For instance, the second metal may be selected from the group consisting of ruthenium, rhodium, palladium, osmium, iridium, scandium, titanium, vanadium, manganese, zirconium, titanium, niobium, molybdenum, tungsten and rhenium, or from the group consisting of ruthenium, rhodium, palladium, titanium, and zirconium, such as ruthenium.

The reflective layer suitably comprises alternating layers of molybdenum, or diamond-like carbon, and silicon, arranged to provide high reflectivity for EUV radiation.

The features set out hereinbefore are applicable to all aspects of the invention, as appropriate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
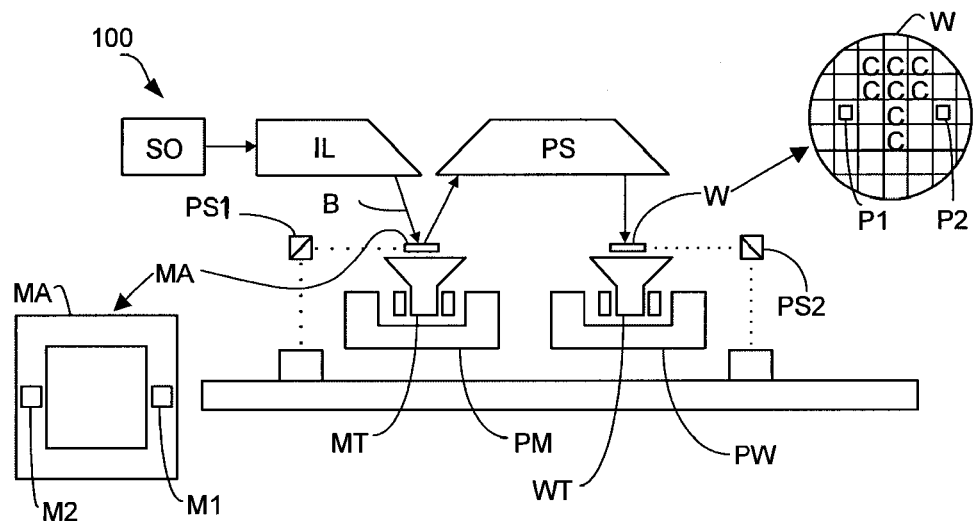
FIG. 1 depicts a lithographic apparatus according to an embodiment of the invention.

FIG. 1 schematically depicts a lithographic apparatus 100, including a source collector module SO, according to one embodiment of the invention. The apparatus comprises: an illumination system (illuminator) IL configured to condition a radiation beam B, for instance of EUV radiation; a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation. Typically, the illumination system will include reflective optical components suitable for use in reflection of the EUV radiation used in the lithography apparatus of the invention.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective, but for EUV radiation will typically include or consist of reflective optical components. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet (EUV) radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g. EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source. The source will typically include reflective optical components which may comprise or consist of reflective optical components according to an aspect of the invention.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g. mask) MA, which is held on the support structure (e.g. mask table) MT, and is patterned by the patterning device. After being reflected from the patterning device (e.g. mask, which may comprise or consist of one or more a reflective optical components according to an aspect of the invention) MA, the radiation beam B passes through the projection system PS, which focuses the beam onto a target portion C of the substrate W. This projection system may also include reflective optical components comprising or consisting of reflective optical components according to an aspect of the invention. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-) magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
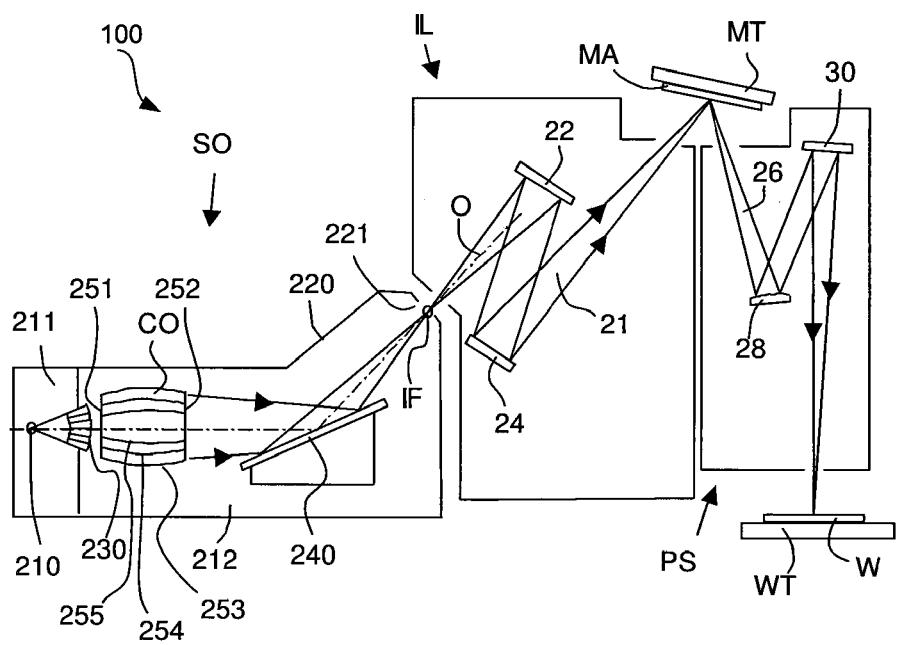
FIG. 2 is a more detailed view of the apparatus of FIG. 1, including a discharge produced plasma source collector module.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. The reflective optical components of the radiation collector may comprise or be reflective optical components according to an aspect of the invention. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. These reflective optical components may comprise or consist of reflective optical components according to an aspect of the invention. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2. Any or all of these reflective optical components may be according to an aspect of the invention.

Collector optic CO, as illustrated in FIG. 2, is depicted as a nested collector with grazing incidence reflectors 253, 254 and 255, just as an example of a collector (or collector mirror) which may be according to an aspect of the invention. The grazing incidence reflectors 253, 254 and 255 are disposed axially symmetric around an optical axis O and a collector optic CO of this type is preferably used in combination with a discharge produced plasma source, often called a DPP source.

Figure 3:
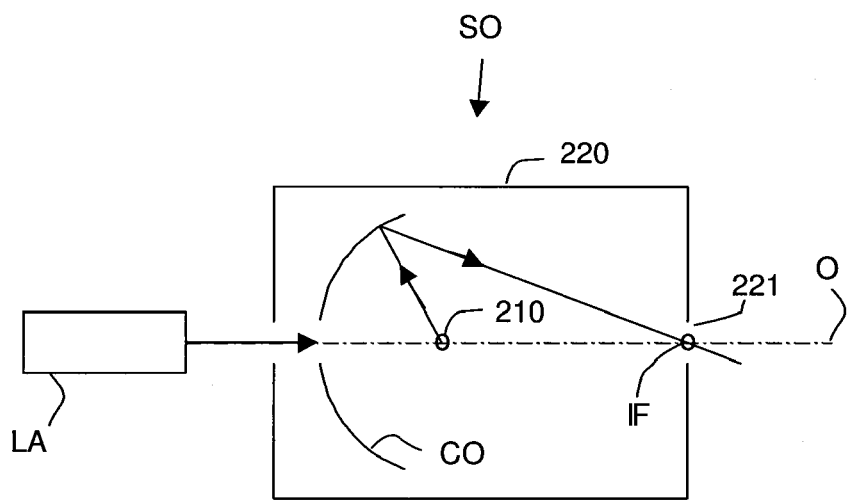
FIG. 3 is a view of an alternative source collector module of the apparatus of FIG. 1, the alternative being a laser produced plasma source collector module.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
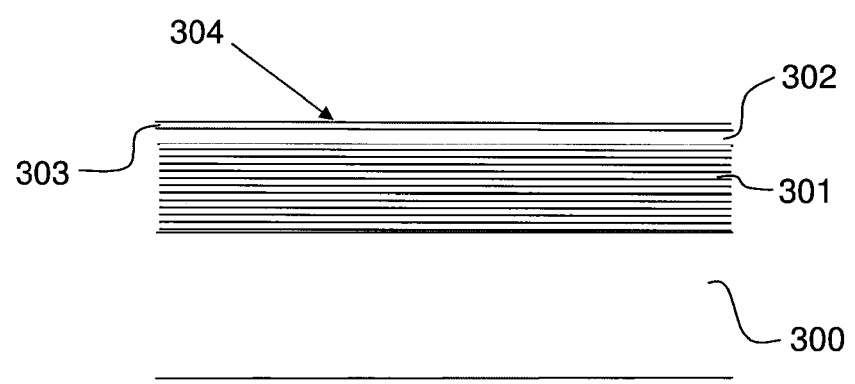
FIG. 4 depicts a schematic cross sectional view through a reflective optical component according to an embodiment of the invention.

FIG. 4 shows a carrier 300, which is an optically flat carrier, having a reflective layer 301 of alternating molybdenum and silicon layers arranged to provide high reflectivity for EUV radiation. For instance there may be 50 or more than 50 alternating double layers of Mo/Si used to form a reflective coating, with each double layer perhaps having a thickness of less than 10 nm. The molybdenum may be substituted, for instance, by diamond-like carbon (DLC).

In the embodiment shown, a first metal base layer 302, having a thickness of about 2 nm or less, has been deposited onto the reflective layer. A surface layer of second metal 303 is deposited on the base layer. The surface metal layer 303 is a monolayer of the second metal in the embodiment shown, though this layer may be 5 monolayers of the second metal or fewer. With greater numbers of monolayers, an outer surface 304 of the surface layer 303 of second metal may behave as a surface of bulk second metal. Without wishing to be bound by theory, it is thought that distortions to the packing and interatomic spacings of the second metal in the surface layer, arising from the need to match lattice spacings to the base layer of first metal, give rise to modification of the bond energy of the second metal at its outer surface 304, leading to weaker adsorption of sulfur-containing contaminants such as $SO_2$. Deposition of the first and second metals onto the reflective layer may be achieved, for instance, by sputtering, chemical vapor deposition or any other suitable method.

Desirably, the bimetal cap layer (302+303) has a thickness of 4 nm or less, such as 2 nm or less, so that the amount of EUV radiation absorbed by the layer is not substantial, but the cap layer is sufficiently thick to be mechanically stable to cleaning operations.

The first metal of the base layer 302, may be ruthenium, rhodium, palladium, osmium, iridium, titanium, zirconium, or niobium, or may be ruthenium, rhodium, palladium, titanium, or zirconium, such as titanium, in order to give low EUV absorption. The second metal of the surface layer 303 may be ruthenium, rhodium, palladium, osmium, iridium, scandium, titanium, vanadium, manganese, zirconium, titanium, niobium, molybdenum, tungsten, or rhenium, or may be ruthenium, rhodium, palladium, titanium, or zirconium, to ensure high resistance to oxidation in addition to providing low adsorption of sulfur-containing compounds, bearing in mind that the second and first metals are different metals. When the first metal is titanium, the second metal is desirably ruthenium.

In another embodiment, not shown, the cap layer may be a single alloy layer, comprising from 3:1 to 1:3 molar ratio of the first to second metals, for example from 2:1 to 1:2, or from 3:2 to 2:3, whereby the modified bond energy of the alloy leads to weakened adsorption of sulfur-containing contaminants such as $SO_2$.

The reflective layer suitably comprises alternating layers of molybdenum, or diamond-like carbon, and silicon, arranged to provide high reflectivity for EUV radiation.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured. For instance, the invention may be of use when EUV is used in a process step of device manufacture or patterning device preparation for imprint lithography.

The term "lens", where the context allows, may refer to any one or combination of various types of optical components, including refractive, reflective, magnetic, electromagnetic and electrostatic optical components.

The term "EUV radiation" may be considered to encompass electromagnetic radiation having a wavelength within the range of 5-20 nm, for example within the range of 13-14 nm, or example within the range of 5-10 nm such as 6.7 nm or 6.8 nm.

The descriptions above are intended to be illustrative, not limiting. Thus it will be apparent to one skilled in the art that modifications may be made to the invention as described without departing from the scope of the claims set out below.

What is claimed is:

1. A reflective optical component configured to reflect EUV radiation, the reflective optical component comprising: a reflective layer having a bimetal cap layer thereon, the bimetal cap layer comprising a base layer of a first metal deposited on and in contact with the reflective layer and a surface layer of a second metal, different from the first metal, deposited on and in contact with the base layer, wherein an outer surface of the cap layer is substantially unreactive to sulfur compounds by the first metal being selected from the group consisting of: ruthenium, rhodium, palladium, osmium, iridium, titanium, zirconium, and niobium, the second metal being selected from the group consisting of: ruthenium, rhodium, palladium, osmium, iridium, scandium, titanium, vanadium, manganese, zirconium, titanium, niobium, molybdenum, tungsten, and rhenium, and the surface layer comprising fewer than 5 monolayers of the second metal.

2. The reflective optical component according to claim 1, wherein the surface layer is substantially a monolayer of the second metal.

3. The reflective optical component according to claim 1, wherein the bimetal cap layer has a thickness of 4 nm or less.

4. The reflective optical component according to claim 1, wherein the first metal is selected from the group consisting of: ruthenium, rhodium, palladium, titanium, and zirconium.

5. The reflective optical component according to claim 1, wherein the second metal is selected from the group consisting of: ruthenium, rhodium, palladium, titanium, and zirconium.

6. The reflective optical component according to claim 1, wherein the reflective layer comprises alternating layers of molybdenum or diamond-like carbon, and silicon.

7. The reflective optical component according to claim 1, wherein the first metal is titanium and the second metal is ruthenium.

8. The reflective optical component according to claim 1, wherein the first metal is palladium and the second metal is rhodium.

9. The reflective optical component according to claim 1, wherein the first metal is palladium and the second metal is zirconium.

10. The reflective optical component according to claim 1, wherein distortions to packing and interatomic spacings of the second metal in the surface layer due to matched lattice spacings to the base layer of the first metal cause modification of bond energy of the second metal at the outer surface, leading to weaker adsorption of the sulfur compounds.

11. A reflective optical component configured to reflect EUV radiation, the reflective optical component comprising:
   a reflective layer having a cap layer deposited on and in contact with the reflective layer, wherein the cap layer is an alloy of a first metal and a second metal, the second metal being different from the first metal, configured to render an outer surface of the cap layer substantially unreactive to sulfur compounds, wherein a molar ratio of the first metal to the second metal in the alloy is from 3:1 to 1:3.

12. A reflective optical component configured to reflect EUV radiation, the reflective optical component comprising:
   a reflective layer; and
   a bimetal cap layer deposited on and in contact with the reflective layer, the bimetal cap layer comprising:
      a base layer of a first metal selected from the group consisting of ruthenium, rhenium and palladium, titanium, and zirconium deposited on and in contact with the reflective layer; and
      a surface layer of a second metal deposited on and in contact with the base layer, wherein the second layer comprises fewer than 5 monolayers of the second metal, creating an outer face of the surface layer having a lower adsorption coefficient for sulfur than a surface of the first metal.

13. A lithographic apparatus comprising:
   an illumination system configured to condition an EUV radiation beam;
   a support constructed to support a patterning device, the patterning device being configured to impart the radiation beam with a pattern in its cross-section to form a patterned radiation beam;
   a substrate table constructed to hold a substrate;
   a projection system configured to project the patterned radiation beam onto a target portion of the substrate; and
   a reflective optical component configured to reflect EUV radiation, the reflective optical component comprising a reflective layer having a bimetal cap layer thereon, the bimetal cap layer comprising a base layer of a first metal deposited on and in contact with the reflective layer and a surface layer of a second metal, different from the first metal, deposited on and in contact with the base layer, wherein an outer surface of the cap layer is substantially unreactive to sulfur compounds by the first metal being selected from the group consisting of: ruthenium, rhodium, palladium, osmium, iridium, titanium, zirconium, and niobium, the second metal is being selected from the group consisting of: ruthenium, rhodium, palladium, osmium, iridium, scandium, titanium, vanadium, manganese, zirconium, titanium, niobium, molybdenum, tungsten, and rhenium, and the surface layer comprising fewer than 5 monolayers of the second metal.

14. A lithographic projection apparatus arranged to project a pattern of EUV radiation from a patterning device onto a substrate, wherein the lithographic projection apparatus comprises a reflective optical component configured to reflect EUV radiation, the reflective optical component comprising a reflective layer having a bimetal cap layer thereon, the bimetal cap layer comprising a base layer of a first metal deposited on and in contact with the reflective layer and a surface layer of a second metal, different from the first metal, deposited on and in contact with the base layer, wherein an outer surface of the cap layer is substantially unreactive to sulfur compounds by the first metal is being selected from the group consisting of: ruthenium, rhodium, palladium, osmium, iridium, titanium, zirconium, and niobium, the second metal is being selected from the group consisting of: ruthenium, rhodium, palladium, osmium, iridium, scandium, titanium, vanadium, manganese, zirconium, titanium, niobium, molybdenum, tungsten, and rhenium, and the surface layer comprising fewer than 5 monolayers of the second metal.

15. An illumination apparatus for EUV lithography, arranged to condition an EUV radiation beam, wherein the illumination apparatus comprises a reflective optical component configured to reflect EUV radiation, the reflective optical component comprising a reflective layer having a bimetal cap layer thereon, the bimetal cap layer comprising a base layer of a first metal deposited on and in contact with the reflective layer and a surface layer of a second metal, different from the first metal, deposited on and in contact with the base layer, wherein an outer surface of the cap layer is substantially unreactive to sulfur compounds by the first metal is being selected from the group consisting of: ruthenium, rhodium, palladium, osmium, iridium, titanium, zirconium, and niobium, the second metal being selected from the group consisting of: ruthenium, rhodium, palladium, osmium, iridium, scandium, titanium, vanadium, manganese, zirconium, titanium, niobium, molybdenum, tungsten, and rhenium, and the surface layer comprising fewer than 5 monolayers of the second metal.

16. An EUV source suitable for EUV lithography comprising one or more reflective optical components configured to reflect EUV radiation, the reflective optical component comprising a reflective layer having a bimetal cap layer thereon, the bimetal cap layer comprising a base layer of a first metal deposited on and in contact with the reflective layer and a surface layer of a second metal, different from the first metal, deposited on and in contact with the base layer, wherein an outer surface of the cap layer is substantially unreactive to sulfur compounds by the first metal being selected from the group consisting of: ruthenium, rhodium, palladium, osmium, iridium, titanium, zirconium, and niobium, the second metal being selected from the group consisting of: ruthenium, rhodium, palladium, osmium, iridium, scandium, titanium, vanadium, manganese, zirconium, titanium, niobium, molybdenum, tungsten, and rhenium, and the surface layer comprising fewer than 5 monolayers of the second metal.

17. A device manufacturing method comprising:
   reflecting an EUV radiation beam with a reflective optical component configured to reflect EUV radiation, the reflective optical component comprising a reflective layer having a bimetal cap layer thereon, the bimetal cap layer comprising a base layer of a first metal deposited on and in contact with the reflective layer and a surface layer of a second metal, different from the first metal, deposited on and in contact with the base layer, wherein an outer surface of the cap layer is substantially unreactive to sulfur compounds by the first metal being selected from the group consisting of: ruthenium, rhodium, palladium, osmium, iridium, titanium, zirconium, and niobium, the second metal being selected from the group consisting of: ruthenium, rhodium, palladium, osmium, iridium, scandium, titanium, vanadium, manganese, zirconium, titanium, niobium, molybdenum, tungsten, and rhenium, and the surface layer comprising fewer than 5 monolayers of the second metal; and
   projecting a patterned EUV radiation beam onto a substrate.

* * * * *